US009871178B2

(12) United States Patent
Yeh

(10) Patent No.: US 9,871,178 B2
(45) Date of Patent: Jan. 16, 2018

(54) LIGHT-EMITTING DIODE DEVICE

(71) Applicant: Epistar Corporation, Hsinchu (TW)

(72) Inventor: Hui-chun Yeh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/954,465

(22) Filed: Nov. 30, 2015

(65) Prior Publication Data

US 2016/0087181 A1 Mar. 24, 2016

Related U.S. Application Data

(62) Division of application No. 13/796,044, filed on Mar. 12, 2013, now Pat. No. 9,203,003.

(30) Foreign Application Priority Data

Mar. 12, 2012 (TW) ............................ 101108402 A

(51) Int. Cl.
*H01L 33/62* (2010.01)
*H01L 27/15* (2006.01)
*H01L 33/38* (2010.01)

(52) U.S. Cl.
CPC ............ *H01L 33/62* (2013.01); *H01L 27/153* (2013.01); *H01L 27/156* (2013.01); *H01L 33/38* (2013.01); *H01L 2224/48091* (2013.01); *H01L 2224/49107* (2013.01)

(58) Field of Classification Search
CPC ....... H01L 33/36; H01L 33/38; H01L 33/382; H01L 33/385; H01L 33/387; H01L 33/62
See application file for complete search history.

(56) References Cited

U.S. PATENT DOCUMENTS 7,709,849 B1 * 5/2010 Kal ...................... H01L 27/153 257/96
2005/0225973 A1 * 10/2005 Eliashevich .......... H01L 27/153 362/217.1

(Continued)

FOREIGN PATENT DOCUMENTS

CN 102169934 A 1/2017

*Primary Examiner* — Peniel M Gumedzoe
(74) *Attorney, Agent, or Firm* — Ditthavong & Steiner, P.C.

(57) ABSTRACT

A light-emitting diode device is disclosed, which comprises a substrate including a first surface; a plurality of light-emitting diode units formed on the first surface, each of the light-emitting diode units including a first semiconductor layer, a second semiconductor layer formed on the first semiconductor layer, and an active layer formed between the first semiconductor layer and the second semiconductor layer; and a plurality of conductive connecting structures, spatially separated from each other, wherein one end of one of the plurality of conductive connecting structure is arranged on the second semiconductor layer, directly contacted with the second semiconductor layer, and electrically connected with each other through the second semiconductor layer; wherein another end of the one of the conductive connecting structures is arranged on another light-emitting diode unit, and directly contacted with one of the semiconductor layers of the another light-emitting diode unit.

17 Claims, 7 Drawing Sheets

(56) References Cited

U.S. PATENT DOCUMENTS

2008/0099772 A1* 5/2008 Shuy .................... H01L 27/156 257/88
2008/0217629 A1* 9/2008 Lee ...................... H01L 27/153 257/88
2010/0102337 A1* 4/2010 Lee ...................... H01L 27/153 257/88
2011/0210311 A1 9/2011 Kim et al.

* cited by examiner

LIGHT-EMITTING DIODE DEVICE

CROSS REFERENCE TO RELATED APPLICATIONS

This application is a divisional application of U.S. patent application Ser. No. 13/796,044 entitled "LIGHT-EMITTING DIODE DEVICE", filed on Mar. 12, 2013, now pending, which claims the right of priority based on Taiwanese patent application, Ser. No. 101108402, entitled "Light-Emitting Diode Device", filed on Mar. 12, 2012, and the content of which is hereby incorporated by reference in its entirety.

BACKGROUND OF THE INVENTION

1. Technical Field

The present application relates to a light-emitting diode device, and in particular to a light-emitting diode device with high light extraction efficiency.

2. Description of the Related Art

Different from the conventional lighting, the emitting principles and structures of light-emitting diode devices (LEDs) have advantages such as low power consumption, long operational life, without warming-time, quick response, small volume, shockproof and high productivity. LEDs have been widely used in applications and are easily to form small or array devices, such as the optical display devices, laser diodes, traffic lights, data storage devices, communication devices and medical devices.

Referring to FIG. 1A and FIG. 1B, a conventional light-emitting diode device 1 comprises a transparent substrate 10, a plurality of light-emitting diode units 12 extended two dimensionally and formed close to each other on the transparent substrate 10. Each stack 120 of the light-emitting diode units 12 comprises a first semiconductor layer 121, an active layer 122, and a second semiconductor layer 123. Because the transparent substrate 10 is not conductive, gaps 14 formed by etching between the light-emitting diode epitaxial stacks 120 can insulate the light-emitting diode units 12 from each other. Next, partial exposed area is exposed by etching the light-emitting diode epitaxial stacks 120 to the first semiconductor layer 121. Then, forming a conductive connecting structure 19 including a first electrode 18 and a second electrode 16 on the exposed area of the first semiconductor layer 121 of the light-emitting diode epitaxial stack 120 and the second semiconductor layer 123 of adjacent light-emitting diode epitaxial stack 120 respectively. The first electrode 18 and the second electrode 16 respectively comprise a first electrode extension 180 and a second electrode extension 160 formed on the first semiconductor layer 121 of the light-emitting diode epitaxial stack 120 and the second semiconductor layer 123 of adjacent light-emitting diode epitaxial stack 120 to help current spread evenly into the semiconductor layer. The conductive connecting structure 19 selectively connects the second semiconductor layer 123 and the first semiconductor layer 121 of adjacent light-emitting diode units 12 to form serial circuits or parallel circuits between the light-emitting diode units 12. There can be air or an insulating layer 13 beneath the conductive connecting structures 19 where in the insulating layer 13 is formed on the partial surface of epitaxial stacks of the light-emitting diode unit 12 and the space between the epitaxial stacks of adjacent light-emitting diode unit 12 by CVD, PVD, sputtering and so on before forming the conductive connecting structures 19 to protect the epitaxial stacks and insulate the adjacent light-emitting diode units. The material of the insulating layer 13 comprises $Al_2O_3$, $SiO_2$, AlN, $SiN_x$, $TiO_2$, $Ta_2O_5$, or the combination thereof.

However, when the conductive connecting structure 19 electrically connects the light-emitting diode units 12, because the depth of the gap 14 between the light-emitting units 12 is large, it is easy to cause bad connection or broken line when forming conductive connecting structures 19, and the yield of the devices is influenced therefore.

Furthermore, the light-emitting diode device 1 mentioned above can connect to other devices to form a light-emitting apparatus. FIG. 2 is a schematic diagram illustrated the conventional light-emitting apparatus. As shown in FIG. 2, a light-emitting apparatus 100 comprises a sub-mount 110 comprising a circuit 101, and the light-emitting diode device 1 is fixed onto the sub-mount 110; an electrical connection structure 104 electrically connects a first electrode pad 16' and a second electrode pad 18' of the light-emitting diode device 1 and the circuit 101 of the sub-mount 110. The sub-mount 110 can be the lead frame or the large mounting substrate which is convenient for the circuit layout of the light-emitting diode device 100 and suitable for heat dissipation. The electrical connection structure 104 can be the bonding wires or other connecting structures

SUMMARY OF THE DISCLOSURE

The present application provides a light-emitting diode device, especially a light-emitting diode device with a high light extraction efficiency.

An embodiment of the present application provides a light-emitting diode device including a substrate including a first surface; a plurality of light-emitting diode units formed on the first surface, each of the light-emitting diode units including a first semiconductor layer, a second semiconductor layer formed on the first semiconductor layer, and an active layer formed between the first semiconductor layer and the second semiconductor layer; and a plurality of conductive connecting structures, spatially separated from each other, wherein one end of one of the plurality of conductive connecting structures is arranged on the second semiconductor layer, directly contacted with the second semiconductor layer, and electrically connected with each other through the second semiconductor layer; wherein another end of the one of the plurality of conductive connecting structures is arranged on another light-emitting diode unit, and directly contacted with one of the semiconductor layers of the another light-emitting diode unit.

A light-emitting diode device including: a substrate including a first surface; a plurality of light-emitting diode units formed on the first surface, each of the light-emitting diode units including: a first semiconductor layer; a second semiconductor layer formed on the first semiconductor layer; an active layer formed between the first semiconductor layer and the second semiconductor layer; a first sidewall with a length of a micron; and a plurality of conductive connecting structures, spatially separated from each other, wherein all of the plurality of conductive connecting structures are formed on the first sidewall of the light-emitting diode units; wherein at least $(a/100)-1$ conductive connecting structures are formed on the first sidewall of the light-emitting diode units.

A light-emitting diode device including: a substrate including a first surface; a plurality of light-emitting diode units formed on the first surface, each of the light-emitting diode units including: a first semiconductor layer; a second semiconductor layer formed on the first semiconductor layer; an active layer formed between the first semiconductor layer and the second semiconductor layer; a first sidewall; a second sidewall opposite to the first sidewall; and a plurality of conductive connecting structures, spatially separated from each other, all of the plurality of conductive connecting structures respectively formed on the first sidewall and the second sidewall of any of the light-emitting diode units; and wherein the first sidewall of one of the plurality of the light-emitting units comprising n conductive connecting structures (wherein n is an integer, and n>1), and the second sidewall of one of the light-emitting diode units comprising m conductive connecting structures (wherein m is an integer, and m≥1)

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

The following shows the description of the embodiments of the present disclosure in accordance with the drawings. With the Market demand, the sizes of light-emitting diode devices are miniaturized. When the area of each of the light-emitting diode units of the light-emitting diode device is miniaturized correspondingly. Opaque structures such as electrodes formed on the light extraction surface of the light-emitting diode unit, electrode extensions, and conductive connecting structures affect the light extraction efficiencies of the light-emitting diode units correspondingly.

Figure 1A:
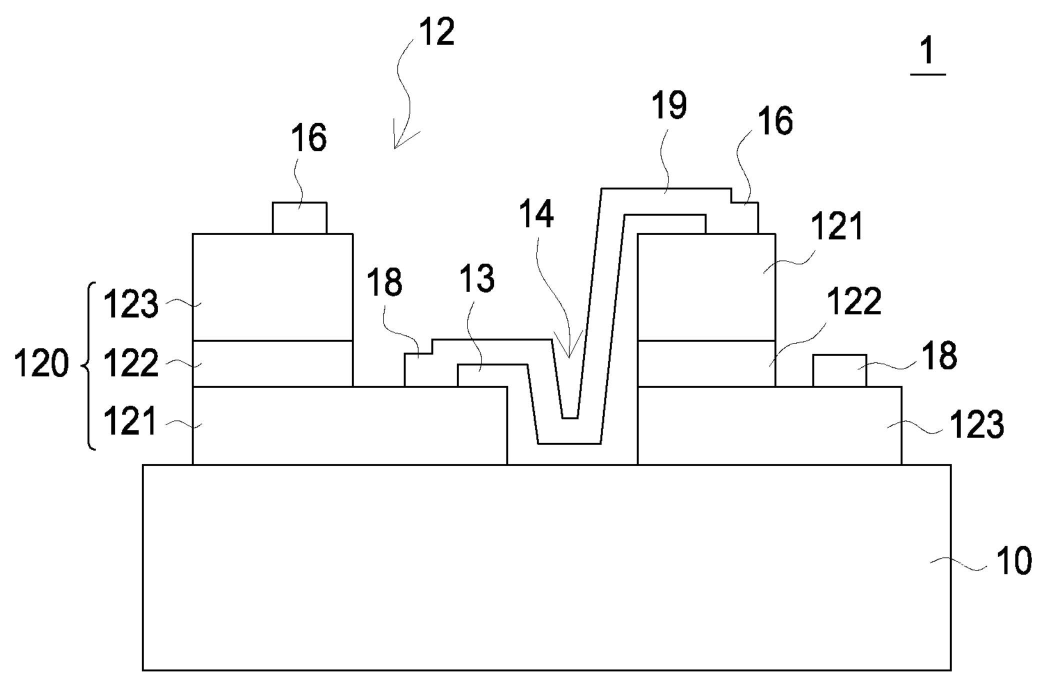
FIG. 1A is a structure diagram showing the side view of a conventional array light-emitting diode device.
Figure 1B:
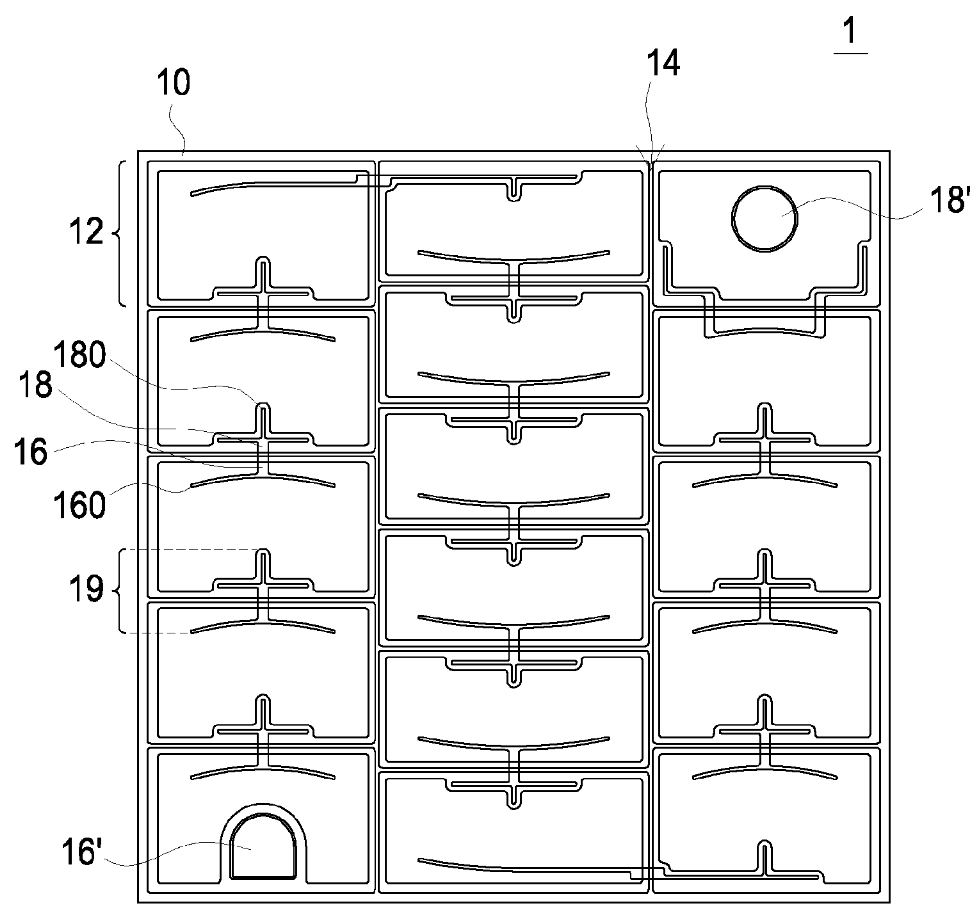
FIG. 1B is a structure diagram showing the top view of a conventional array light-emitting diode device.
Figure 2:
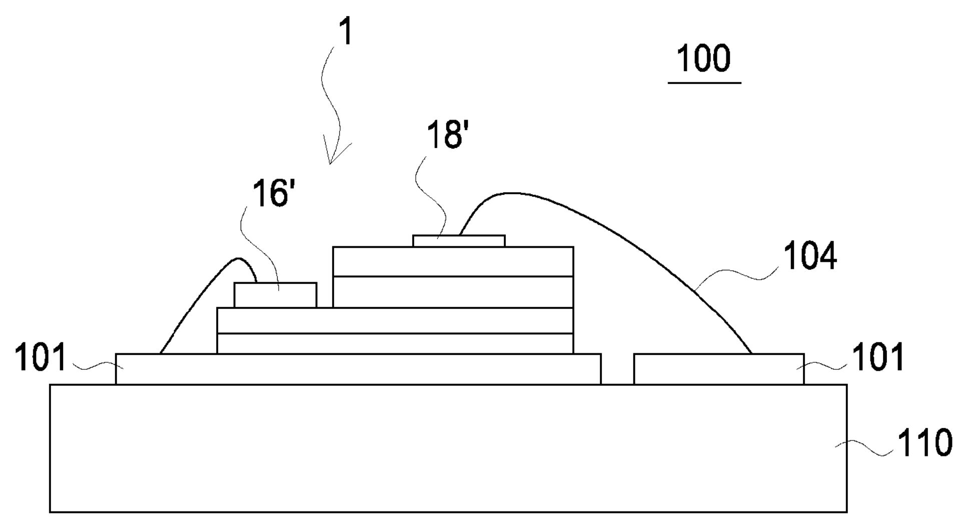
FIG. 2 is a schematic diagram showing the structure of a conventional light-emitting apparatus.
Figure 3A:
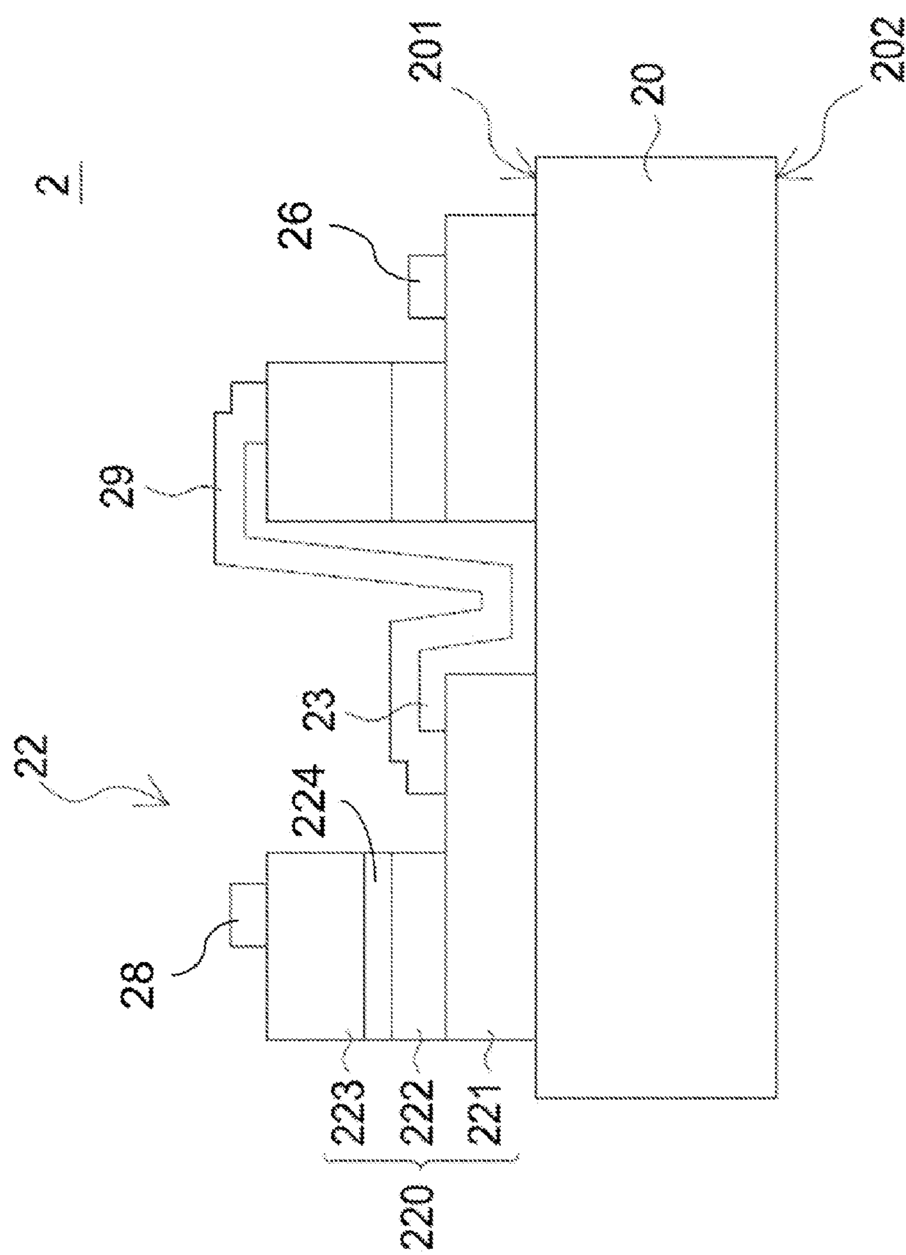
FIG. 3A is a structure diagram showing a sectional view of a light-emitting diode device in accordance with the first embodiment of the present application.
Figure 3B:
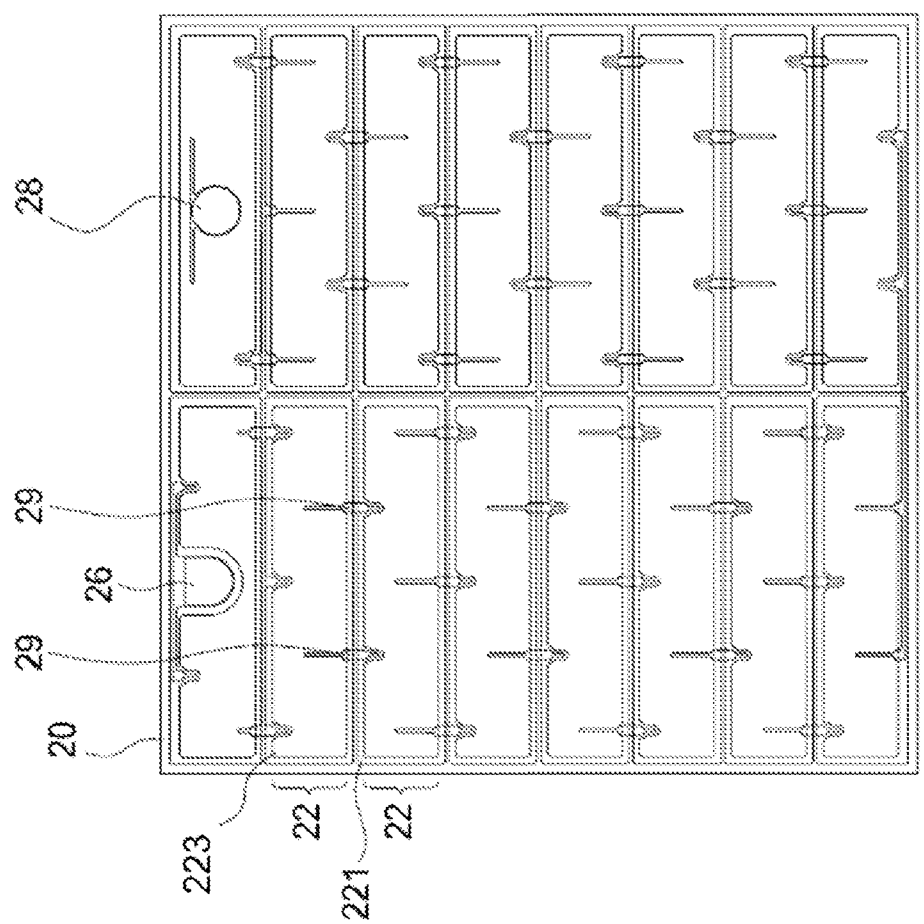
FIG. 3B is a structure diagram showing the top view of a light-emitting diode device in accordance with the first embodiment of the present application.

First, FIG. 3A and FIG. 3B show the sectional view and top view of an array light-emitting diode device 2 in accordance with the first embodiment of the present application. Array light-emitting diode device 2 has a substrate 20 having a first surface 201 and a bottom surface 202, wherein the first surface 201 is opposite to the bottom surface 202. The substrate 20 can be made of a single material, or can be the composite transparent substrate made of multiple materials. For example, the substrate 20 can be made of a first substrate and a second substrate bonded to each other (not shown). In this embodiment, the material of the substrate 20 is sapphire. However, the material of the substrate 20 can be $LiAlO_2$ (lithium aluminum oxide), ZnO (zinc oxide), GaP (gallium phosphide), Glass, Organic polymer sheet, AlN (aluminum nitride), GaAs (gallium arsenide), diamond, quartz, Si (silicon), SiC (silicon carbide), and DLC (diamond like carbon). Then, a plurality of two dimensional extended arranged array light-emitting diode units 22 is formed on the first surface 201 of the substrate 20. The manufacturing process of the array light-emitting diode units 22 is described below:

First, an epitaxial stack is formed on the growth substrate (not shown) by a conventional epitaxial growth process and comprises a first semiconductor layer 221, an active layer 222, and a second semiconductor layer 223. The material of the growth substrate can be GaAs, Ge (germanium), InP (indium phosphide), sapphire, SiC (silicon carbide), silicon, $LiAlO_2$ (lithium aluminum oxide), ZnO (zinc oxide), GaN (gallium nitride), and AlN (aluminum nitride).

Then, as shown in FIG. 3B, a part of the epitaxial stacks is selectively removed by photolithography process technology to form a plurality of separated light-emitting diode epitaxial stacks 220 on the substrate. Furthermore, an exposed area is formed on the first semiconductor layer 221 of each light-emitting diode unit by the photolithography process technology as a platform for forming the following conductive connecting structures.

In order to increase the light extraction efficiency of the device, the light-emitting diode epitaxial stacks 220 can be disposed on the substrate 20 by substrate transferring and substrate bonding technology. The light-emitting diode epitaxial stacks 220 can be bonded to the substrate 20 directly by heating or pressure, or bonded to substrate 20 by a transparent adhesive layer (not shown), wherein the material of the transparent adhesive layer can be organic polymer transparent plastic, such as polyimide, BCB, PFCB, epoxy, acrylic resin, PET, and PC or the combinations, a transparent conductive oxide metal layer, such as ITO, InO, $SnO_2$, FTO, ATO, CTO, AZO, and GZO or the combination thereof, or an inorganic insulating layer, such as $Al_2O_3$, $SiN_x$, $SiO_2$, AlN, $TiO_2$, and $Ta_2O_5$ (Tantalum Pentoxide) or the combination thereof.

In fact, people with ordinary skill in the art can easily understand that the method of arranging the light-emitting diode epitaxial stacks 220 on the substrate 20 is not limited to the above. Depending on different growing characteristics, the light-emitting diode epitaxial stacks 220 can be formed on the substrate 20 directly by epitaxial growth. Furthermore, according to different transferring times of the substrate 20, the structure which has a second semiconductor layer 223 adjacent to the first surface 201 of the substrate 20, the first semiconductor layer 221 on the second semiconductor layer 223, and the active layer 222 between the first semiconductor layer 221 and the second semiconductor layer 223 can be formed.

Then, an insulating layer 23 is formed on the partial surface of the light-emitting diode epitaxial stacks 220 and the space between the light-emitting diode epitaxial stacks 220 by CVD, PVD, or sputtering. The insulating layer 23 can protect the epitaxial stacks and insulate the adjacent light-emitting diode units 22. The material of the insulating layer 23 can be $Al_2O_3$, $SiO_2$, AlN, $SiN_x$, $TiO_2$, and $Ta_2O_5$ or the combination thereof.

Thereafter, forming respectively a plurality of conductive connecting structures 29 spatially separated from each other on the surface of the first semiconductor layer 221 and the surface of the second semiconductor layer 223 of the adjacent light-emitting diode units by sputtering. The conductive connecting structures 29 are spatially separated from each other and extended along one direction (without any electrodes extending toward other directions) on the first semiconductor layer 221, and are directly contacted with the first semiconductor layer 221 such that the conductive connecting structures 29 electrically connected with each other through the first semiconductor layer 221. These spatially separated conductive connecting structures 29 further extend to the second semiconductor layer 223 of the other adjacent light-emitting diode unit 22 for the other end to directly contact the second semiconductor layer 223 of the light-emitting diode unit 22 so the adjacent two light-emitting diode units are connected in series.

In fact, people with ordinary skill in the art can easily understand that the methods to electrically connect two adjacent light-emitting diodes are not limited to the above. By arranging the two ends of the conductive connecting structures on the same or different polarities of semiconductor layers of different light-emitting diode units, the light-emitting diode units can connect in series or in parallel by the conductive connecting structures.

Referring to FIG. 3B, in a serial circuit formed by a serially connected array light-emitting diode device 2, a first electrode pad 26 and a second electrode pad 28 are respectively formed on the first semiconductor layer 221 and the second semiconductor layer 222 of the two light-emitting diode units 22 on the ends of the serial circuit. The two electrode pads can connect electrically with external power source or other circuit devices by wiring or soldering. Furthermore, the electrodes 26, 28 can be formed with the conductive connecting structure 29 can be in one single process, or can be accomplished by multiple processes. The material of the electrode pads 26, 28 can be the same as or different from the material of the conductive connecting structure 29.

Furthermore, to achieve a certain level of conductivity, the material of the conductive connecting structures 29 can be metal such as Au, Ag, Cu, Al, Pt, Ni, Ti, Sn, the alloy or the combination thereof.

Besides the first semiconductor layer 221 and the second semiconductor layer 222, one layer or several same or different semiconductor layers can be formed between the substrate 20 and the second semiconductor layer 223 based on the requirement of different functions and characteristics. For example, a buffer layer can be formed between the substrate 20 and the first semiconductor layer 221 as a stress release layer to release the stress generated during epitaxial process. Furthermore, the second semiconductor layer 223 can be a transparent metal oxide layer formed on the active layer 222, and one layer 224 or multiple layers can be formed between the second semiconductor layer 223 and the active layer 222. Because the transparent metal oxide layer has better lateral current spreading performance, it can help to spread the current evenly into the beneath semiconductor layers. Generally, the bandgap of the transparent metal oxide layer varies from 0.5 eV to 5 eV according to dopant types and formation processes so the transparent metal oxide layer is considered as semiconductor structure. In the embodiment, the transparent metal oxide layer is ITO with a bandgap between 3.2 eV to 4.2 eV and is a semiconductor structure. The material of the transparent oxide metal layer can also be ZnO, InO, $SnO_2$, FTO, ATO, CTO, AZO, GZO, and the combination thereof.

Since these conductive connecting structures 29 are arranged on the semiconductor layers in one direction, there is no redundant electrode extensions and electrodes. Comparing with the conventional light-emitting diode units, the percentage of the light shading area of the light-emitting diode units 22 is reduced and the light extraction efficiency is increased.

According to the experimental results, the distance of lateral current spreading of the metal conductive connecting structure on the surface of the light-emitting diode unit is limited to about 100 microns (μm). Therefore, in order to spread the current in the semiconductor layer evenly, it is necessary to adjust the arrangements of the conductive connecting structures on the semiconductor layers of the light-emitting diode units. In addition, the shape of the light-emitting diode units can be changed to adjust the current spreading efficiency between the light-emitting diode units.

Figure 4:
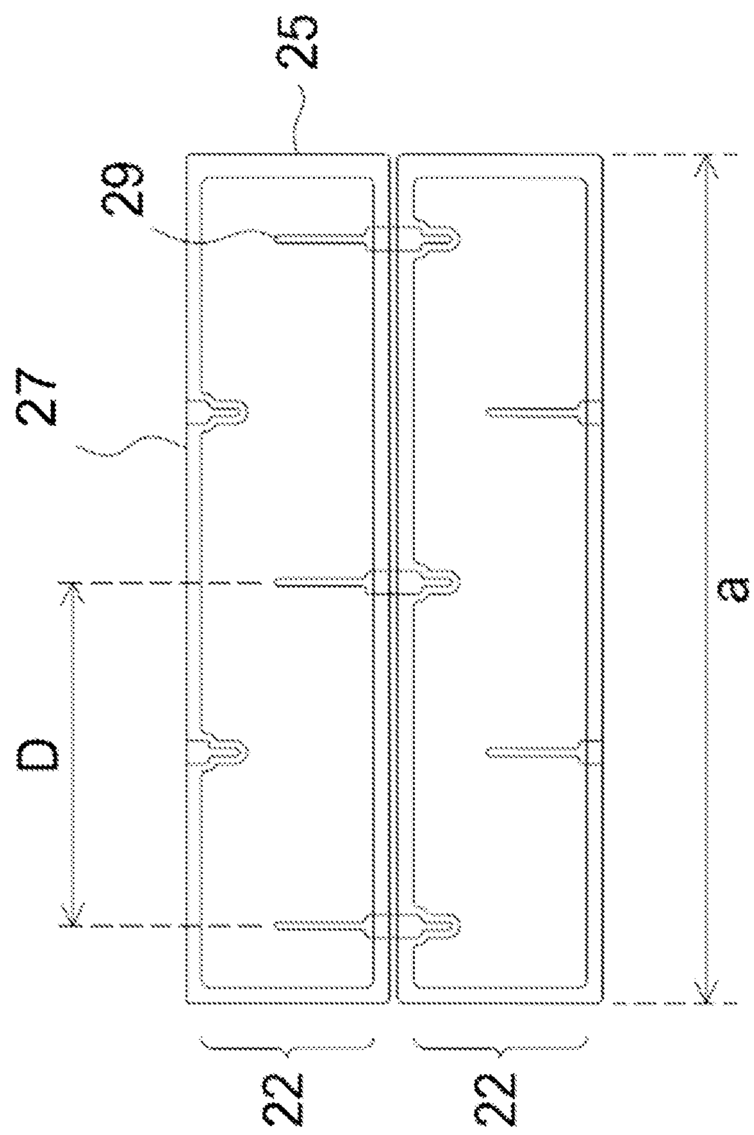
FIG. 4 is a diagram showing the partial plan view of the light-emitting diode device in accordance with the first embodiment of the present application.

FIG. 4 shows two of the light-emitting diode units of the light-emitting diode device 2 in serial connection. In order to achieve the uniform current spreading, a plurality of the conductive connecting structures 29 is disposed on the horizontal sidewall 27 of the light-emitting diode unit 22. The horizontal spacing D of every conductive connecting structure is less than 100 microns. In other words, when the length of the horizontal sidewall is a micron, at least $(a/100)-1$ conductive connecting structures are disposed on the horizontal sidewall 27. In the embodiment, the length of the horizontal sidewall 27 is about 240 microns. In order to make the horizontal spacing between conductive connecting structures 29 on the horizontal sidewall 27 less than 100 microns, the number of the conductive connecting structures 29 is more than $(240/100)-1=1.4$. As described in this embodiment, 2 or 3 conductive connecting structures are disposed on the one horizontal sidewall 27. On the vertical sidewall 25, because there is no conductive connecting structures and the electrode extension which can help the current spreading, to keep the spacing between conductive connecting structures less than 100 microns, the length of the vertical sidewall is designed to be less than 150 microns. Each light-emitting diode unit has a first horizontal sidewall and a second horizontal sidewall opposite to the first horizontal sidewall. In order to spread the current more evenly, the conductive connecting structures 29 can be interlaced on the two horizontal sidewalls. In this embodiment, the conductive connecting structures arranged on the first horizontal sidewall, the second horizontal sidewall, the first horizontal sidewall, the second horizontal sidewall, and the first horizontal sidewall form the left side to the right side, wherein the first horizontal sidewall has 3 conductive connecting structures, and the second horizontal sidewall has 2 conductive connecting structures.

In fact, people with ordinary skill in the art can easily understand that the method of arranging the conductive connecting structures is not limited to the above. The numbers and the positions of the conductive connecting structures arranged on the two sidewalls can be adjusted based on different characteristics like extension direction and the length of the sidewalls so the numbers of the conductive connecting structures can be the same or different.

Figure 5:
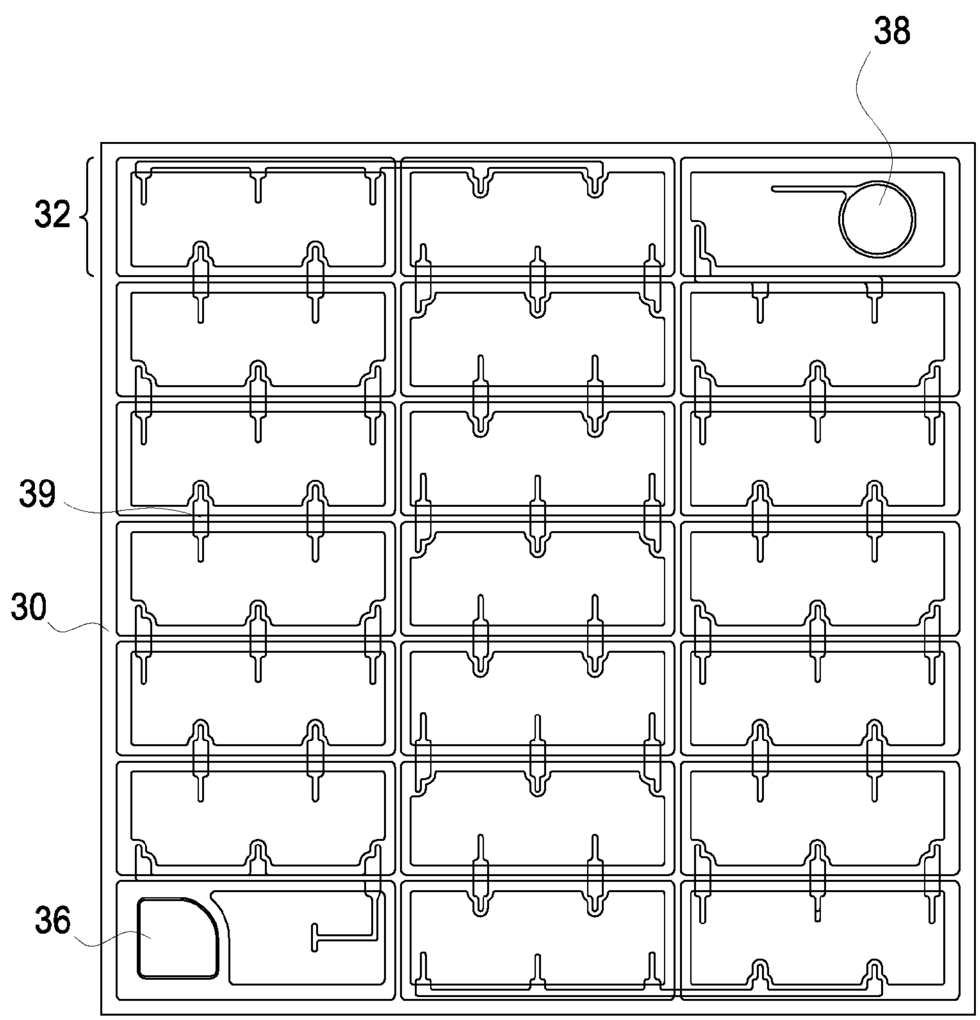
FIG. 5 is a structure diagram showing the top view of the two-dimensional array light-emitting diode device in accordance with the second embodiment of the present application.

FIG. 5 shows the second embodiment in accordance with the present application. The basic structure of the light-emitting diode device 3 is similar with the light-emitting diode device 2 disclosed in the first embodiment, and the similar code shows the similar structure in below description. The light-emitting diode device 3 has a substrate 30 and a plurality of array light-emitting diode units 32 formed on the substrate 30. A plurality of conductive connecting structures 39 is disposed separately on each of the opposite sidewalls of the light-emitting diode units 32 according to the above rules above to electrically connect two adjacent light-emitting diode units 32. On the two opposite ends or two opposite sides of the substrate, the first electrode pad 36 and the second electrode pad 38 are disposed on the two adjacent light-emitting diode units 32 of the two ends of the circuit to connect to the light-emitting diode units electrically to the external power source and electrical devices.

The foregoing description has been directed to the specific embodiments of this invention. It will be apparent, however, that other alternatives and modifications may be made to the embodiments without escaping the spirit and scope of the application.

What is claimed is:

1. A light emitting diode device, comprising:

a substrate including a first surface;

a plurality of light-emitting diode units formed on the first surface wherein each of the light-emitting diode units comprises:

a first semiconductor layer; and a second semiconductor layer formed on the first semiconductor layer; and a first group of conductive connecting structures spatially separated from each other and electrically connecting the plurality of light-emitting diode units, wherein each conductive connecting structure comprises a middle part, a first extending part and a second extending part;

wherein the first extending parts of the first group of conductive connecting structures are arranged on and electrically connected with the second semiconductor layer of a same one of the plurality of light-emitting diode units, and the second extending parts of the first group of conductive connecting structures are arranged on and connected with one of the first and second semiconductor layers of an adjacent light-emitting diode unit of the plurality of light-emitting diode units;

wherein the first and the second extending parts have different length.

2. The light-emitting diode device of claim 1, wherein a distance between two adjacent conductive connecting structures arranged on the same one of the plurality of light-emitting diode units is less than 100 microns.

3. The light-emitting diode device of claim 1, wherein the first and the second extending parts extend from the middle part; wherein a width of the middle part is wider than a width of the first extending part or the second extending part.

4. The light-emitting diode device of claim 1, wherein the same one of the plurality of light-emitting diode units comprises a pair of horizontal sidewalls and a pair of vertical sidewalls; wherein one of the horizontal sidewalls is longer than one of the vertical sidewalls, and the first extending parts of the first group of conductive connecting structures are arranged on a same one of the horizontal sidewalls of the same one of the plurality of light-emitting diode units.

5. The light-emitting diode device of claim 4, wherein the horizontal sidewall has a length of A microns, wherein A is a real number and larger than 100, and a number of the first group of conductive connecting structures formed on the same one of the horizontal sidewalls is an integer larger than $(A/100)-1$.

6. The light-emitting diode device of claim 4, further comprising a second group of conductive connecting structures formed on the same one of the plurality of light-emitting diode units;

wherein the pair of horizontal sidewalls comprises a first horizontal sidewall and a second horizontal sidewall parallel with the first horizontal sidewall;

wherein the first group of conductive connecting structures and the second group of conductive connecting structures are formed on the first and the second horizontal sidewalls respectively.

7. The light-emitting diode device of claim 6, wherein each one of the first group of conductive connecting structures and each one of the second group of conductive connecting structures are arranged alternately.

8. The light-emitting diode device of claim 6, wherein the first group of conductive connecting structures comprises n conductive connecting structures (wherein n is an integer, and $n>1$), and the second group of conductive connecting structures comprises m conductive connecting structures (wherein m is an integer, and $m\geq 1$), wherein n is not equal to m.

9. The light-emitting diode device of claim 4, wherein the conductive connecting structures are not arranged on the pair of vertical sidewalls.

10. The light-emitting diode device of claim 4, wherein a length of one of the vertical sidewalls is less than 150 microns.

11. The light-emitting diode device of claim 1, wherein each two of the first group of conductive connecting structures next to each other on the same one of the plurality of light-emitting diode units are arranged with an interval, and the intervals are equal.

12. The light-emitting diode device of claim 1, further comprising:

a pad formed on the first semiconductor layer of another one of the plurality of light-emitting diode units; and a third extending part, extending from the pad and arranged along one sidewall of the another one of the plurality of light-emitting diode units.

13. The light-emitting diode device of claim 1, wherein the first semiconductor layer and the second semiconductor layer have different conductivity types.

14. The light-emitting diode device of claim 1, wherein the second extending parts of the first group of conductive connecting structures, which are arranged on and connected with the first semiconductor layers of the adjacent light-emitting diode unit, extend in one direction.

15. The light-emitting diode device of claim 1, wherein the second semiconductor layer comprises a transparent oxide metal layer, and the first extending parts of the first group of conductive connecting structures directly contact the transparent oxide metal layer.

16. The light-emitting diode device of claim 15, wherein the second extending parts of the first group of conductive connecting structures directly contact one of the first and second semiconductor layers of the adjacent light-emitting diode unit.

17. The light-emitting diode device of claim 6, wherein each of the second group of conductive connecting structures comprises a middle part, a first extending part and a second extending part.

* * * * *